(12) United States Patent
Fox

(10) Patent No.: US 7,117,416 B1
(45) Date of Patent: *Oct. 3, 2006

(54) METHOD AND APPARATUS TO FACILITATE SELF-TESTING OF A SYSTEM ON CHIP

(75) Inventor: Brian Fox, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/021,636

(22) Filed: Dec. 23, 2004

Related U.S. Application Data

(63) Continuation of application No. 09/866,080, filed on May 25, 2001, now Pat. No. 6,857,092.

(60) Provisional application No. 60/226,460, filed on Aug. 17, 2000.

(51) Int. Cl.
*G01R 31/28* (2006.01)

(52) U.S. Cl. ........................................ 714/733; 714/725

(58) Field of Classification Search ................ 714/725, 714/733, 718, 738; 365/185.22
See application file for complete search history.

(56) References Cited

U.S. PATENT DOCUMENTS

| | | | |
|---|---|---|---|
| 5,012,180 A | 4/1991 | Dalrymple et al. | |
| 5,717,851 A | 2/1998 | Yishay et al. | |
| 6,003,150 A * | 12/1999 | Stroud et al. | 714/725 |
| 6,026,501 A | 2/2000 | Hohl et al. | |
| 6,331,957 B1 | 12/2001 | Kurts et al. | |
| 6,356,960 B1 | 3/2002 | Jones et al. | |
| 6,425,101 B1 | 7/2002 | Garreau | |
| 6,467,009 B1 | 10/2002 | Winegarden et al. | |
| 6,550,030 B1 * | 4/2003 | Abramovici et al. | 714/725 |
| 6,601,126 B1 | 7/2003 | Zaidi et al. | |
| 6,665,214 B1 * | 12/2003 | Cheah et al. | 365/185.22 |
| 6,839,873 B1 * | 1/2005 | Moore | 714/725 |
| 6,874,110 B1 * | 3/2005 | Camarota | 714/733 |

FOREIGN PATENT DOCUMENTS

| | | |
|---|---|---|
| EP | 0 636 976 A1 | 2/1995 |
| JP | 04-333963 A | 11/1992 |
| WO | WO 00/22546 | 4/2000 |

* cited by examiner

*Primary Examiner*—David Ton
(74) *Attorney, Agent, or Firm*—Blakely Sokoloff Taylor & Zafman

(57) ABSTRACT

A method and apparatus for providing a system-on-a-chip comprising a processor and a configurable system logic (CSL) including a plurality of banks arranged in an array coupled to the processor. The system on a chip further includes a built-in self test (BIST) mechanism coupled to the CSL to perform tests on the CSL to verify that the banks and interconnections between the banks are functioning properly.

15 Claims, 13 Drawing Sheets

METHOD AND APPARATUS TO FACILITATE SELF-TESTING OF A SYSTEM ON CHIP

The present nonprovisional patent application claims priority under 35 U.S.C. § 119(e) to prior provisional patent application No. 60/226,460, filed Aug. 17, 2000, entitled PROGRAMMABLE LOGIC ENHANCEMENTS TO FACILITATE BUILT IN SELF TEST.

FIELD OF THE INVENTION

The present invention relates to a system on chip, and more specifically, to built-in self-testing for a system on chip.

BACKGROUND

System on a chip is an integrated circuit that includes a processor, a bus, and other elements on a single monolithic substrate. A system on a chip may include a configurable logic unit. The configurable logic unit includes a processor, interface, and a programmable logic on the same substrate.

Generally, systems on a chip are tested using external test gear. However, this is inconvenient, as it requires expensive test equipment, and eliminates the possibility of testing in the field.

One prior art method of solving the problem of testing for a non-configurable system on a chip is using a built-in-self-test (BIST) mechanism. However, a configurable system on a chip, one that includes configurable logic, is not compatible with the self-testing systems that currently exist. Therefore, alterations to the system-on-chip are needed, to simplify self-testing and to make self-testing more comprehensive.

SUMMARY OF THE INVENTION

A method and apparatus for providing a system-on-a-chip comprising a processor and a configurable system logic (CSL) including a plurality of banks arranged in an array coupled to the processor. The system on a chip further includes a built-in self test (BIST) mechanism coupled to the CSL to perform tests on the CSL to verify that the banks and interconnections between the banks are functioning properly.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A method and apparatus for simplifying self-testing of a configurable system on a chip is described. The present system is designed to reduce the complexity and cost of test equipment required to test a configurable system on a chip. A built-in self test (BIST) mechanism is adapted to hook into the configurable part of the configurable system on a chip, which permits the testing of the configurable portion of the system on a chip.

A configurable system on a chip (CSOC) integrates a CPU, an internal system bus, programmable logic also referred to as configurable system logic (CSL), and various system resources all interconnected and communicating via the internal system bus on a single substrate. For one embodiment, the substrate may be silicon. However, alternative substrate materials may be used. For one embodiment, one of the system resources provides a dedicated external memory interface function. For one embodiment, the CSOC structures described in copending application Ser. No. 09/172,918, now U.S. Pat. No. 6,467,009, entitled "PROCESSOR, PROGRAMMABLE LOGIC, AND BUS ON A SINGLE INTEGRATED CIRCUIT," filed Oct. 14, 1998 may be used. That application is hereby incorporated by reference in its entirety.

Figure 1:
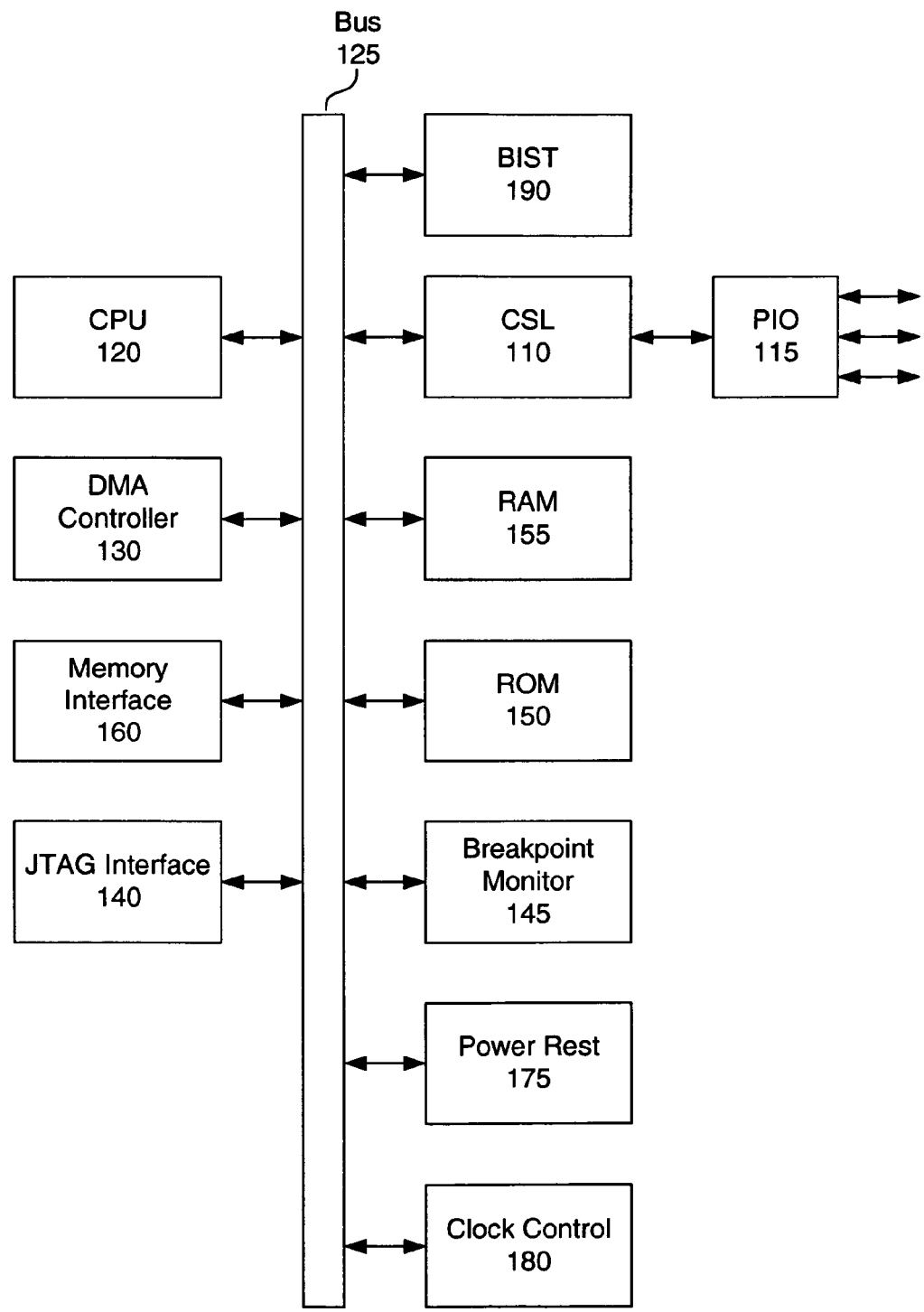
FIG. 1 is an overview block diagram of one embodiment of a Configurable System on a Chip (CsoC).

A block diagram of the CSOC 100 identifying one embodiment of the system resources is shown in FIG. 1. Those system resources that reside on the internal system bus are shown to the left of the bus and arbiter block 125 if they are masters, and to the right if they are slaves, in typical application. Note, however, that each of the devices on the left may be a slave in some applications, and some of the devices on the right may be masters in some configurations.

Figure 2:
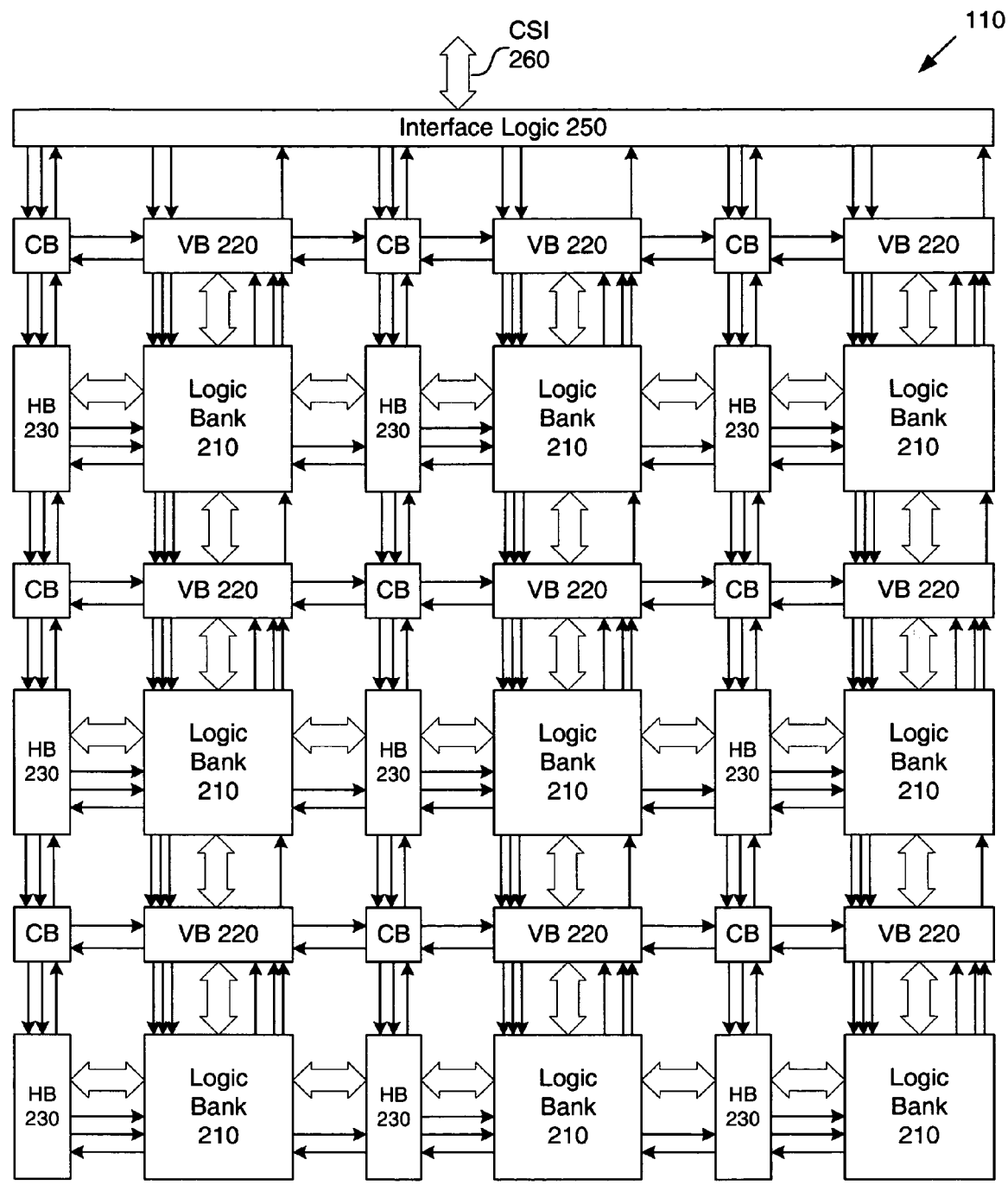
FIG. 2 is a block diagram of one embodiment of a configurable system logic (CSL).

The CPU 120, CSL 110, PIOs 115, and memory interface 160 are shown. The CPU 120 is a processor, while the CSL 110 is a configurable logic such as a programmable logic array (PLA), programmable array logic (PAL), field programmable gate array (FPGA), or another type of configurable logic. One embodiment of the configuration of the CSL 110 is shown in FIG. 2. The PIO 115 is the input/output system, which is interfaced to the CSL 110. The PIO 115 is used to communicate with devices outside the CSOC 100. For one embodiment, the CSL 110 may be further coupled to a BIST (built-in self test) engine 190, which controls testing. The functions of the BIST engine 190 will be described in more detail below. The BIST engine 190 may be used for testing all devices, by sending signals through the bus 125, or being directly coupled to certain elements, without use of the bus 125. For example, FIG. 1 shows the BIST engine 190 coupled to the CSL 110 through bus 125. Alternatively, the BIST engine 190 is coupled directly to the CSL 110 without going through bus 125. For one embodiment, the BIST 190 may be coupled to external testing devices directly. For another embodiment, the BIST 190 may be coupled to external testing devices through the CSL 110 and the PIO 115. For one embodiment, the BIST engine 190 may be coupled to external testing devices through the bus 125 and the JTAG 140, or through the bus 125 and memory interface 160.

The various system resources may also include internal random access memory (RAM) 155, a small internal ROM 150 containing fixed initialization code, a controller for performing direct memory access (DMA) 130, a JTAG interface 140 (Joint Test Action Group) with bus master extensions, and an internal bus monitor and breakpoint unit 145. The power and reset control 175 section generally does not have a bus interface. Clock signals may be coupled to the bus from clock control 180. There is also a group of control registers that are not shown in the diagram. For one embodiment, these control registers determine the operating characteristics of each of the system resources. This is discussed in more detail below. The memory bits that determine the configuration of the CSL 110 are assigned to an addressable region on the internal system bus 125. The CSL 110 also has the slave side of the internal system bus 125 distributed throughout along with many programmable bus interface decoders and pipeline registers that may then be used by the user programmable logic within the CSL 110.

FIG. 2 is a block diagram of one embodiment of a configurable system logic (CSL). When integrating programmable logic with a CPU or other CSOC components, mechanisms for connecting system-level resources to the CSL 110 are provided. System-level resources may include but are not limited to system data, address, and control signals, pipelining registers, buffering, and miscellaneous logic for interacting with system-level components such as the CPU.

To achieve satisfactory system-level integration of a homogeneous CSL 210, some of the system-level circuitry co-resides with the programmable resources in the interior of the CSL 210. The CSL 210 establishes a hierarchical distribution of system-level circuitry with the programmable resources in a homogeneous CSL 210, in such a way as to gain the benefits of hierarchical organization while retaining the benefits of a homogeneous array.

A homogeneous CSL consists of a more or less regular array of similar units of programmable logic resources. These units are called tiles, because they correspond to design units of physical layout, which are then tiled to form an array.

In a homogeneous CSL, the tiling is almost completely regular. Slight variations may exist from tile to tile to achieve different interconnect recombination. More substantial variations occur at the edges of the array, typically to optimize the connections of the CSL to bonding pads at the perimeter of the chip.

In addition, homogeneous arrays may have one or more columns or rows of special tiles in interior of the array dedicated to distribution of power, ground, or clock signals. The presence and organization of these special tiles is irrelevant to the functional and topological organization of the programmable resources in the CSL.

This method organizes the tiles of the CSL into a semi-homogeneous array. The array is divided into multiple sub-arrays, called banks 210, where each bank is divided from the other banks in the CSL 210 by a row or column of special breaker tiles 220, 230, 240. The division between banks is not absolute. The breaker tiles 220, 230, 240 are designed such that the fabric of programmable interconnect is topologically continuous from each bank to its neighbor. For one embodiment, interconnect long lines, which span the entire width or height of a bank do not cross the breaker tiles. Instead, each long line is confined to a single bank.

The breaker tiles 220, 230, 240 contain programmable connections between long lines in adjacent banks. Long lines in adjacent banks are electrically connected through a programmable connection in the breaker tiles 220, 230, 240. Together with the unbroken fabric of other programmable interconnects across bank boundaries, the breaker tiles 220, 230, 240 allow the same degree of homogeneity as existing programmable logic architectures. The breaker tiles 220, 230, 240 also contain system-level circuitry such as system data, address, and control signals, pipelining registers, buffering, and miscellaneous logic for integrating the CSL 210 with system-level components such as the CPU. The breaker tile 220, 230, 240 contains programmable connections between this system-level circuitry and the programmable interconnect in adjacent banks. The breaker tiles 220, 230, 240 are joined together to act as a hierarchical network for distribution and collection of system-level signals such as address and data. The breaker tiles may also contain structures for distributing power, ground, and clock signals to the CSL.

Pipeline registers at each bank boundary exist for common timing for different sized die to simplify system level timing.

This method retains the benefits of a homogeneous organization, and allows the application of well-understood placement and routing algorithms.

This structure brings system-level circuitry in close topological proximity to programmable logic throughout the CSL. The maximum physical distance between pipelining registers and any given programmable resource is limited by the size of the bank 210. By choosing an appropriate bank size, different cost/performance tradeoffs are possible. This structure increases the predictability of the timing of system-level signal paths in the CSL, which simplifies software algorithms and typically increases the overall system performance for designs implemented in the CSL. This structure scales very well with different array sizes. The average distance between system-level circuitry and programmable resources stays constant as array size grows. This method enables the programmable separation of the banks into relatively isolated resource pools that can be operated on independently by placement, routing, and other algorithms. This divides what is typically a large and difficult problem into several smaller and simpler problems. As a result, algorithm run times are significantly reduced.

This method reduces the burden that the tiles 210 in the bank bear for supporting integration of system-level signals. By concentrating the system-level connections in the breaker tiles, the other tiles in the bank are relieved of the need to support high-performance integration with circuitry that is physically or topologically remote. This simplifies the design of the other tiles.

One embodiment of the actual layout of a CSL 210 is shown in FIG. 2. The logic banks 210 are bordered by a vertical breaker tile 220 above and below, a horizontal breaker 230 tile on both sides, and corner breaker tiles 240 in all four corners. The logic banks 210 are connected to adjacent logic banks 210, and to the external world through these breaker tiles 220, 230, 240. This pattern of logic tiles 210 and breakers 220, 230, 240 repeats through the entire structure of the system. On one side, on the top as shown in FIG. 2, there is an interface logic 250 to interface the CSL 110 with the world at large. For one embodiment, a configurable system interconnect 260 is used to couple the CSL 110 to various outside signals. These signals may include the PIO, as well as the bus described with respect to FIG. 1. Furthermore, the CSL 110 may be coupled to other elements, such as BIST logic 190.

The specific elements described herein are parts of the CSL. An explanation will be given how they fit into the block diagram shown in FIG. 2. However, it is to be noted that these changes may be made to a system that is structurally different from the one illustrated in FIGS. 1 and 2.

Figure 3:
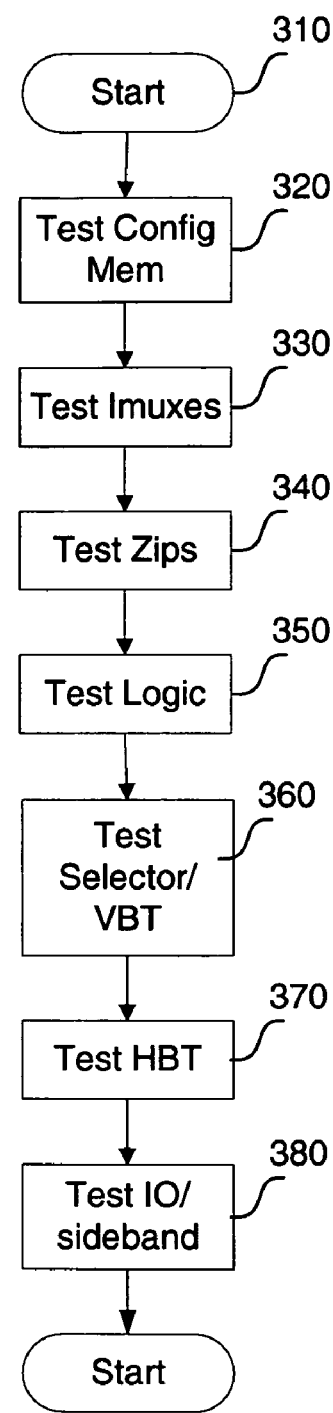
FIG. 3 is an overview flowchart of one embodiment of a self-test procedure that may be implemented.

FIG. 3 is an overview flowchart of one embodiment of a self-test procedure that may be implemented. This Figure illustrates a series of tests. It is to be understood that a subset of these tests may be performed, and that the order in which these tests are illustrated is arbitrary.

The process starts at block 310, when a testing procedure is initialized.

At block 320, the configuration memory is tested. A Cyclic Redundancy Check (CRC) is calculated of read back data on a per nibble per breaker tile basis. The CRC determines whether there was data corruption in the memory.

Figure 4A:
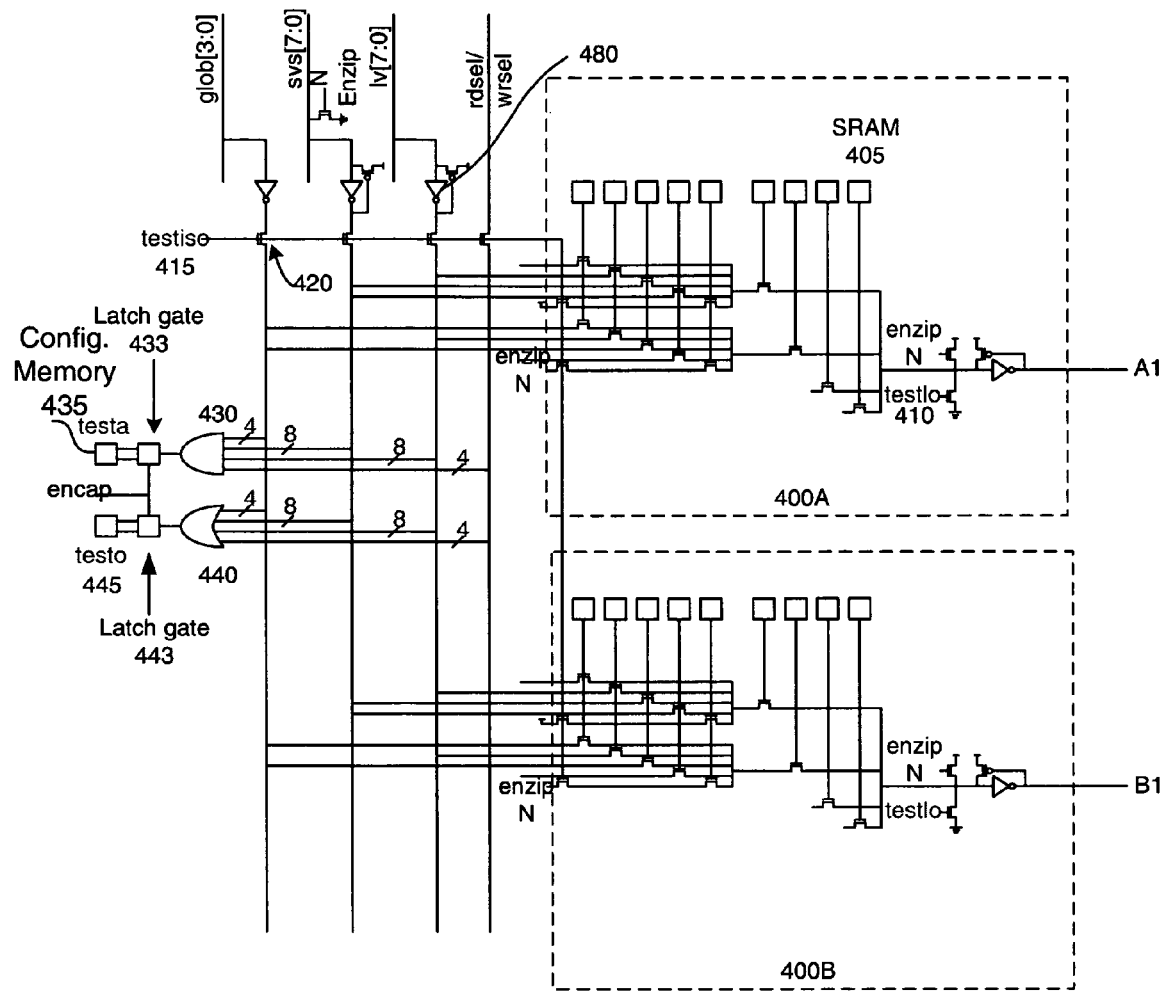
FIG. 4A is a circuit diagram illustrating one embodiment of the input multiplexer alterations for improved self-test capabilities.
Figure 4B:
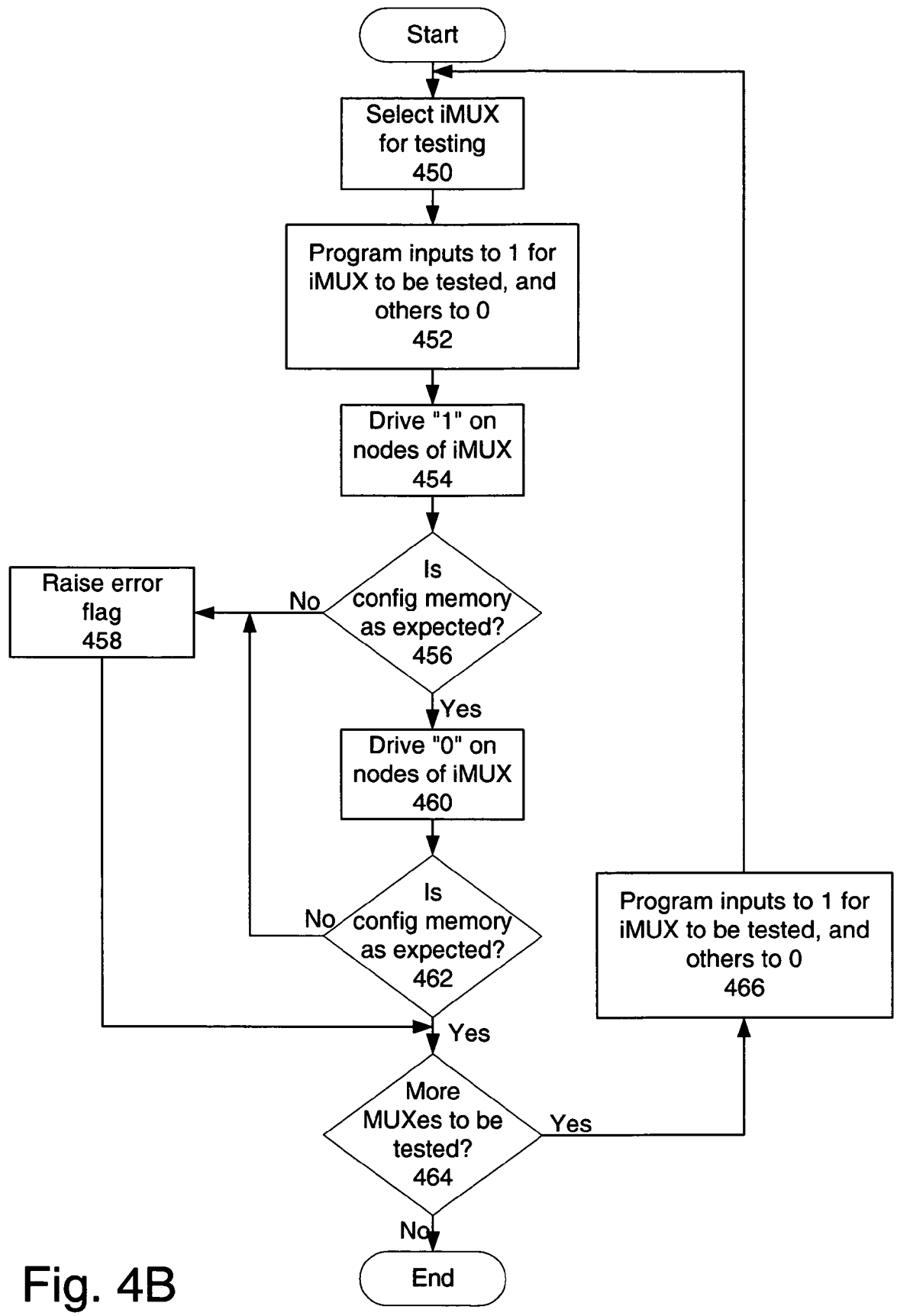
FIG. 4B is a flowchart of one embodiment of the improved input multiplexer test.

At block 330, the process tests the input MUXes. The new sense circuitry, described below in more detail, is used to isolate inputs to the iMUXes. Transistors at the output of the iMUX drive the signal backward through the iMUX. New sense circuitry is used to verify that the iMUX is operating properly. FIG. 4A illustrates the changes to the circuits, while FIG. 4B illustrates a more detailed flowchart of testing the iMUXes.

At block 340, the process tests the ZIP switch boxes. The ZIP buffer is gated with a new signal, to enable driving the interconnect high and low, to determine whether the driving signal is correctly reflected at the buffers before the LBT iMUXes. FIG. 5A is a circuit diagram illustrating one embodiment of the Zip Switch box alterations for improved self-test capabilities, and FIG. 5B is a flowchart of one embodiment of the improved Zip switch box test possible as a result of the alterations of FIG. 5A.

At block 350, the process tests the Logic.

Figure 8:
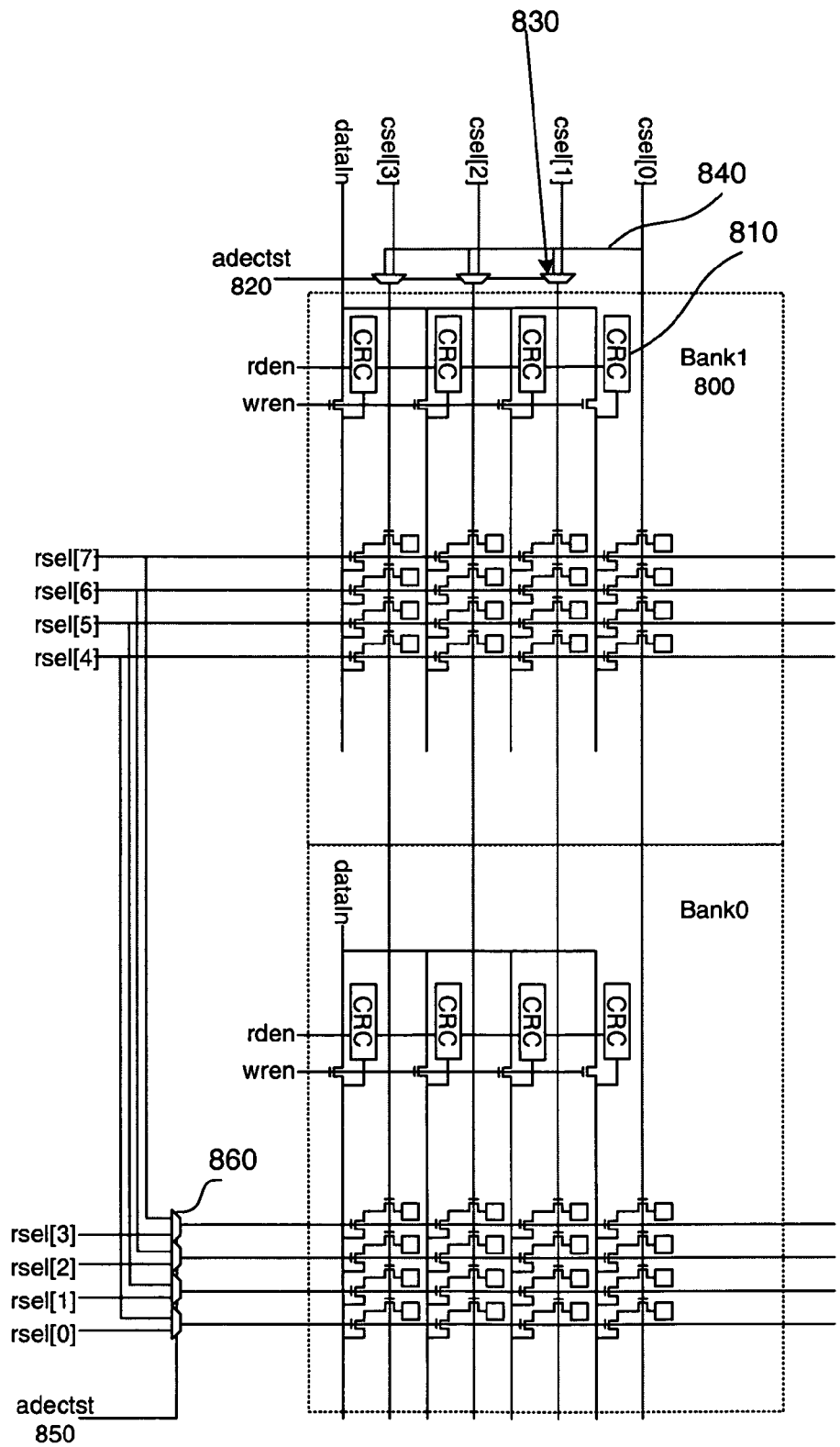
FIG. 8 is a circuit diagram illustrating one embodiment of the RSEL/CSEL gating alterations for improved self-test capabilities.

At block 360, the process tests the Selector/Vertical Breaker Tile. Capture cells capture the match lines of the address decode in each Vertical Breaker Tile. This is used to simplify testing of the address decoders. FIG. 8 is a circuit diagram illustrating one embodiment of the breaker tile alterations for improved self-test capabilities.

At block 370, the process tests the Horizontal Breaker Tile. Logics are inserted at the bank boundary using drivers that control the interconnect lines in the horizontal and vertical breaker tiles. This is used to run array size independent tests.

At block 380, the process tests the Input Output/sideband signals.

At block 390, the testing process ends. Note that additional tests may be added, for example to test various other memory elements, etc. Further, note that certain of these test elements may be deleted as well. In general, to perform a built-in self-test (BIST), all of the above tests are performed. However, this is not necessarily in every instance. Thus, a subset of the above tests may be performed, based on the elements of the CSOC, and the circumstances of the test.

FIG. 4A is a circuit diagram illustrating one embodiment of the input multiplexer alterations for improved self-test capabilities. The iMUXes 400A, 400B include a plurality of memory cells 405. The additional signal testlo 410 is coupled to drive the nodes of iMUX 400 to ground, paralleling the pre-existing enzipN signal. The use of the testlo signal 410 is described below.

A new signal "testiso," 415 or test isolation, is used to isolate input MUXes of one LBT channel, for example iMUX 400A, from the switch box and zip drivers. This eliminates contention, and permits the individual testing of each iMUX. For one embodiment, transistors 420 are used to isolate the input signal lines. Testiso disables the output of the buffers and level shifters that provide the local copies of signals for the tile. Testiso 415 further isolates the selector output signals, and the supply inputs to the iMUX. A new logical AND gate 430 is added to AND all routing resources. A capture configuration memory cell 435 is used to observe the output of the AND. For one embodiment, a latch gate 433 is interposed between AND 430 and memory cell 435, to capture the output of the AND 430.

Similarly, a logical OR gate 440 is added to OR all routing resources. The capture configuration memory cell 445 is used to observe the output of the OR. Again, a latch gate 443 may be interposed. The latches 433, 443 use encap signal to capture the outputs of the OR gate and AND gate at the correct time.

Using this structure adds the buffers, transistors, and metal for the lines to the structure of the iMUX. The overhead is approximately an additional 5% increase in size. The capture memory cells 435, 445 are identical to other memory cells used within the CSL, thus the layouts of the memory cells may be reused throughout the system. This reduces the design complexity of the system.

FIG. 4B is a flowchart of one embodiment of the improved input multiplexer test. At block 450, the process starts, and an iMUX is selected for testing.

At block 455, all of the memory cells of the iMUX are programmed to 1. All other memory cells associated with other iMUXes in the same routing channel, i.e. that may affect outputs, are programmed to zero.

At block 460, a "1" is driven on all nodes of the iMUX. For one embodiment, the EnzipN line is used to drive the "1".

At block 465, the configuration memory is read, to verify that both the AND and OR gate outputs are 1, reflecting that the signal was successfully driven. If one or the other configuration memory is not a 1, the process continues to block 470. At block 470, an error flag is raised, indicating that an error was found. For one embodiment, a "1" or "0" is written into a predetermined memory location, to indicate an error. For one embodiment, the error may be iMUX dependent, such that by reading out the error log, the actual location of the iMUX may be determined. For another embodiment, all test results are written to a single location, and the error flag simply informs the user that an error exists. If the configuration memories were "1's" as expected, the process continues to block 475.

At block 475, the testlo signal is used to drive "0's" on all nodes of the iMUX. At block 480, the configuration memory is read to verify that both the AND and the OR capture cells are "0". If one of the outputs is not a zero, the process continues to block 470, where an error flag is raised. For one embodiment, this may be a different error flag than the flag raised if writing a "1" was unsuccessful.

At block 485, the process determines whether there are any remaining iMUXes in the routing channel. If there are no remaining iMUXes, the process continues to block 490 and ends. Otherwise, the process returns to block 450, and the next iMUX is selected for testing.

This test and the accompanying circuitry add, for one embodiment, 10–15% to the delay through the iMUX, and increase the area of the CSL by 5%. However, it provides the ability to perform a complete self-test of the iMUXes using testers with limited vector memory.

Figure 4C:
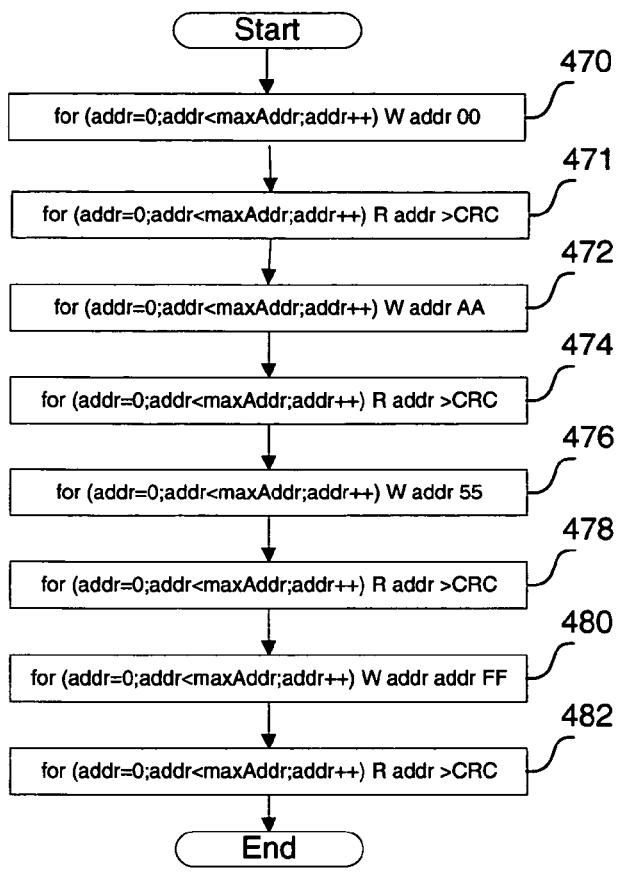
FIG. 4C is a flowchart of one embodiment of a simplified memory test.

FIG. 4C is a flowchart of one embodiment of a simplified memory test. The process starts, and for each address, 00 (hex) is written, at block 470. This writes all zeroes into the memory. At block 471, for each address, the data is read, and pipelined to the CRC logic. If the readout does not match the data written, an error flag is raised. For one embodiment, testing the "00" may be skipped, since this is actually also tested in multiple other tests, when data is written to memory. However, this particular test is a simplified test that treats all memory as a RAM array.

At block 472, all addresses are written to AA (hex). The hex value AA is patterned as 1010.1010. This is a checkerboard pattern, that writes alternating ones and zeroes. Again, at block 474, the addresses are read, and pipelined directly to the CRC.

Subsequently, at block 476, all addresses are written to 55 (hex). The hex value 55 is patterned as 0101.0101, the other half of the checkerboard pattern. Again, the results are pipelined to the CRC, at block 478.

The addresses are then written to FF (hex) at block 480, which is a pattern of all ones. This is read out at 482, and pipelined to the CRC. These outputs become part of the ending CRC output. For one embodiment, separate error flags may be associated with each reading. For one embodiment, the particular memory bank with which the error is associated may also be identified in the error flag. The above writing patterns are merely exemplary. Alternative patterns may, of course, be used. For another embodiment, portions of the patterns may be skipped, such that each memory is written to zero and one once, only.

Figure 4D:
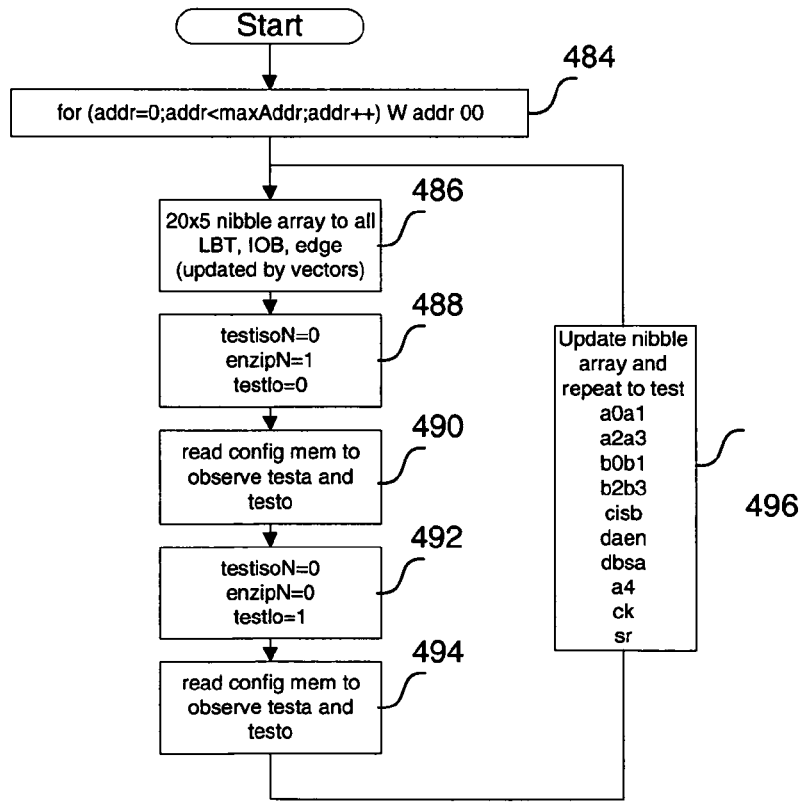
FIG. 4D is a flowchart of one embodiment of an iMUX test.

FIG. 4D is a flowchart of one embodiment of an iMUX test. Initially all addresses are written to zeroes, at block 484. At block 486, vectors are used to write data to the LBT, 10B, and edges. At block 488, testisoN=0 (removing isolation), enzip=1, testlo=0 (pulling the signal to a one.) At block 490, the configuration memory is read, to observe the testA and testO signals. For one embodiment, these signals are routed to the CRC.

At block 492, testisoN=0 (removing isolation), enzip=0, testlo=1 (pulling the signal to a zero.) Again, at block 494, the configuration memory is read, to observe the testA and testO signals.

This process is repeated, as shown in block 496 to test various nibble array configurations. Note that the specific sequence and array descriptions used here are merely exemplary. Alternative tests may be performed. What is tested is whether the iMUXes are successfully configurable in various ways. For one embodiment, only a subset of configurations may be tested. For one embodiment, only those configurations that are not tested by other tests may be used. Thus, there may be unusual configurations that are not tested in other BIST based tests.

Figure 5:
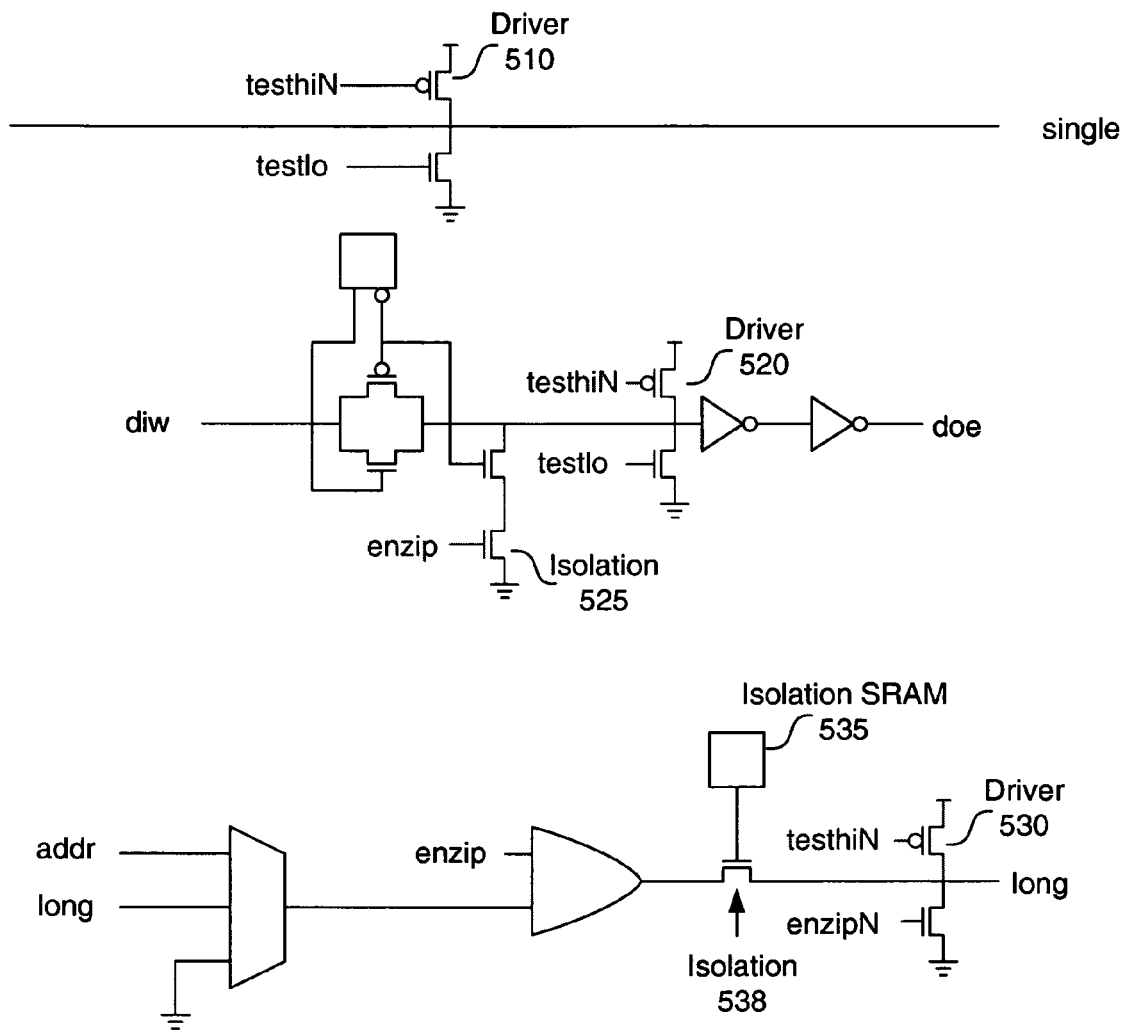
FIG. 5 is a circuit diagram illustrating one embodiment of the breaker tile alterations for improved self-test capabilities.

FIG. 5 is a circuit diagram illustrating one embodiment of the breaker tile alterations for improved self-test capabilities. Driver 510 is added to control the interconnect lines in the horizontal and vertical breaker tiles. FIG. 5 illustrates the three lines that may be tested. The single line simply receives a driver 510, having as inputs testhiN and testlo. This allows logic insertion at the bank boundary. This permits array size independent testing of the line.

Similarly, a driver 520 may be inserted into a Data Out (do) line, such as Data Out East (doe) shown here. Furthermore, an isolation transistor 535 is inserted, to isolate the circuit from other inputs when driver 520 is driving a signal. For one embodiment, the isolation transistor 525 is driven by the enzip signal. The output of the doe line is captured by a capture configuration memory cell in each LBT. As described above, an error flag may be raised if the data in the capture memory cell does not correspond to the data being driven by driver 520.

Similarly, for long lines, driver 530 may be used to drive a signal. The long lines include the transistor controlled by enzipN signal, thus only a single transistor is added. The new transistor is controlled by testhiN. An isolation memory 535 is used to control a transistor 538 to isolate the long line from other inputs. Note that the isolation memory 535 and isolation transistor 538 are existing elements of long lines.

The interconnect drivers permit the other tests to be run array size independently. Furthermore, in conjunction with the isolation elements discussed above, this permits the simultaneous testing of all banks. This increases throughput, decreases delays, and decreases the additional elements needed for array size control for testing.

Figure 6A:
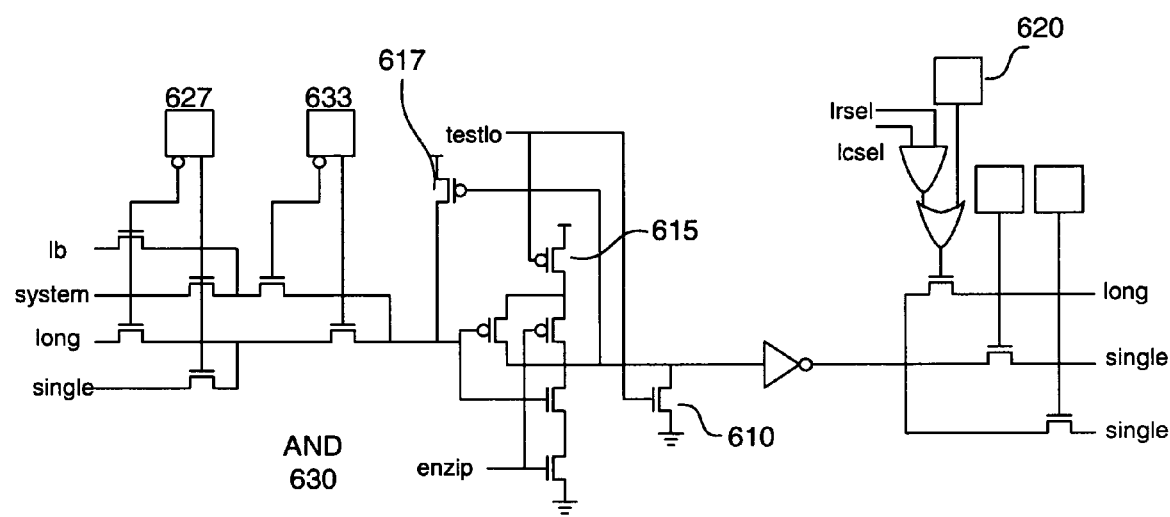
FIG. 6A is a circuit diagram illustrating one embodiment of the Zip Switch box alterations for improved self-test capabilities.

FIG. 6A is a circuit diagram illustrating one embodiment of the Zip Switch box alterations for improved self-test capabilities. The zip modification consists of modifying the NAND gate to allow test control signals to drive the zip output to either a logic 1 or a logic 0. By adding the additional PMOS transistor 615, which has as a gate input the testlo signal, either a zero or one can be driven to the outputs. Level shifter 617 is used as a pull-up transistor, to pull up the "1" signal to Vcc. Pull-down transistor 610 pulls the signal to ground if its gate, driven by the testlo signal, indicates that the output should be driven to a zero.

The switch box is programmed to have the zip box driving the single lines. One tile per row/column drives the long lines. The signal testiso is driven in all of the tiles, so that the AND and OR gates see a buffered version of the zip output. FIG. 6A includes a ZIP iMUX 625, 630, 627, 633. The output of the ZIP iMUX is observed at AND and OR gates in the LBT (not shown). The testing, for one embodiment, may use the following configurations:

| enzip | testlo | input | output |
|-------|--------|-------|--------|
| 0 | 1 | 1 | 1 |
| 0 | 0 | float | 0 |
| 1 | 0 | in | ~in# |

Figure 6B:
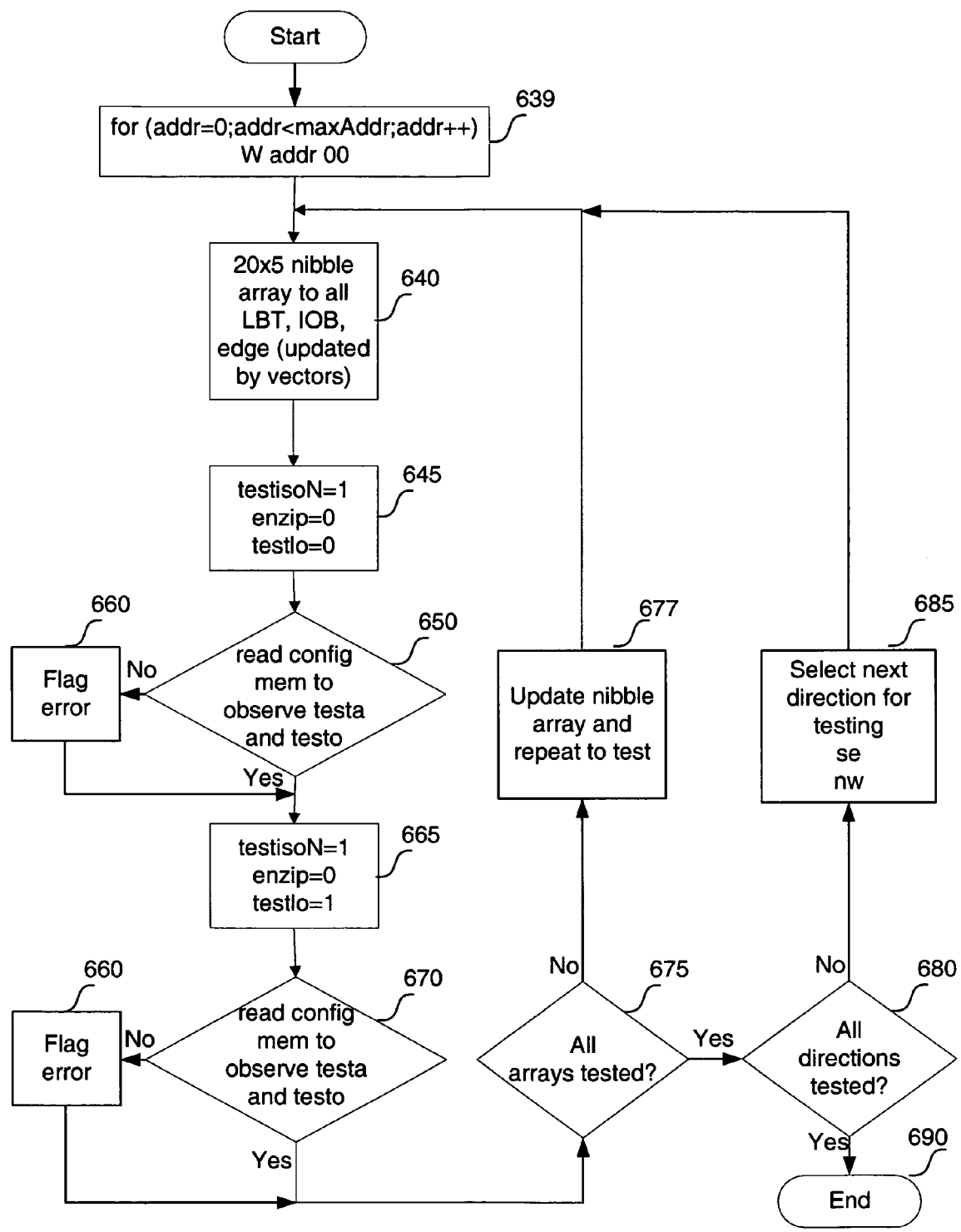
FIG. 6B is a flowchart of one embodiment of the improved Zip switch box test possible as a result of the alterations of FIG. 5A.

FIG. 6B is a flowchart of one embodiment of the improved Zip switch box test possible as a result of the alterations of FIG. 6A. The process starts at block 640, when the testing is initialized. The address is set to cycle through the zip boxes diagonally.

At block 640, the current nibble array is selected for testing using the breaker tiles, I/O tiles, and edges. For one embodiment, this is updated using vectors by using a broadcast write. A single master copy is written in the BIST engine, and reproduced into the tiles by the process. In effect, slave copies of the master copy are written across the entire CSL. This reduces the writing time significantly, since each line need not be activated independently.

Nibble arrays are tested diagonally. For example, a nibble array will be tested from South East to North West and North East to South West.

The testiso signal, or inverted signal testisoN, is set to 1 (to isolate external signals. The enzip and testlo signals are both set to zero.

The configuration memory is then read at block 650 to observer testAND and testOR, the outputs of the AND and OR logics, to verify that both the AND and OR are zero. If either is not a zero, the process continues to block 660, and an error flag is raised. Again, the error flag may simply be a memory to which data is written indicating that an error was found. If no error is found, the process continues to block 665.

At block 665, the inputs are changed to have testlo=1, while enzip and testiso remain at zero. The test process is then repeated, driving a 1 through the system.

At block 670, the configuration memories are read to observe testAND and testOR. If they are incorrect, the process continues to block 660, and the error flag is raised. Otherwise, the process continues to block 675.

At block 675, the process determines whether the complete nibble array has been tested through the current direction. The first direction may be diagonally SouthEast to NorthWest. If the nibble array test has not been completed, the process continues to block 645, and the next nibble array is selected.

If the complete nibble array has been tested in the current direction, the process continues to block 680. At block 680, the process determines whether all testing directions have been completed. If not, at block 685, the next testing direction is selected, and the process continues to block 645 to select the first nibble array in the new testing direction. If all testing directions have been completed, the process ends at block 690.

Figure 7A:
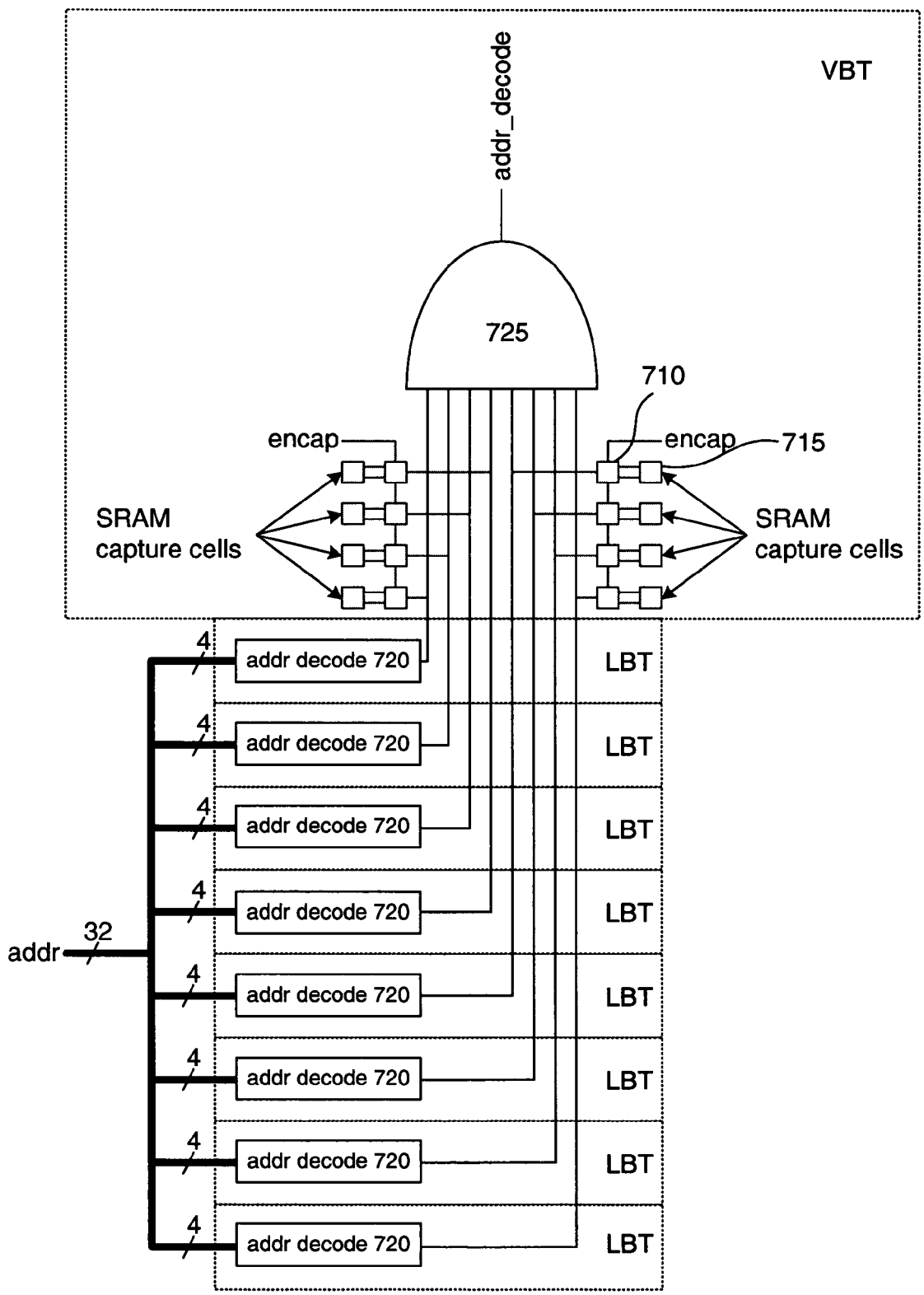
FIG. 7A is a circuit diagram illustrating one embodiment of the address decode circuit alterations for improved self-test capabilities.

FIG. 7A is a circuit diagram illustrating one embodiment of the address decoder alterations for improved self-test capabilities. To the address decoder latches 710 and memories 715 are added. The latches connect to the outputs of the address decoders 720, prior to the AND gate 725, which combines the outputs of the address decoders 720. Using the encap signal, the latches 710 may be triggered, and the captured data sent to the memories 715. The eight match signals available receive new capture configuration memory cells to simplify the 32-bit testing of address decoders. For one embodiment, the capture cells are placed in the vertical breaker tile. For another embodiment, a single capture memory cell may be placed in each logic block tile.

Figure 7B:
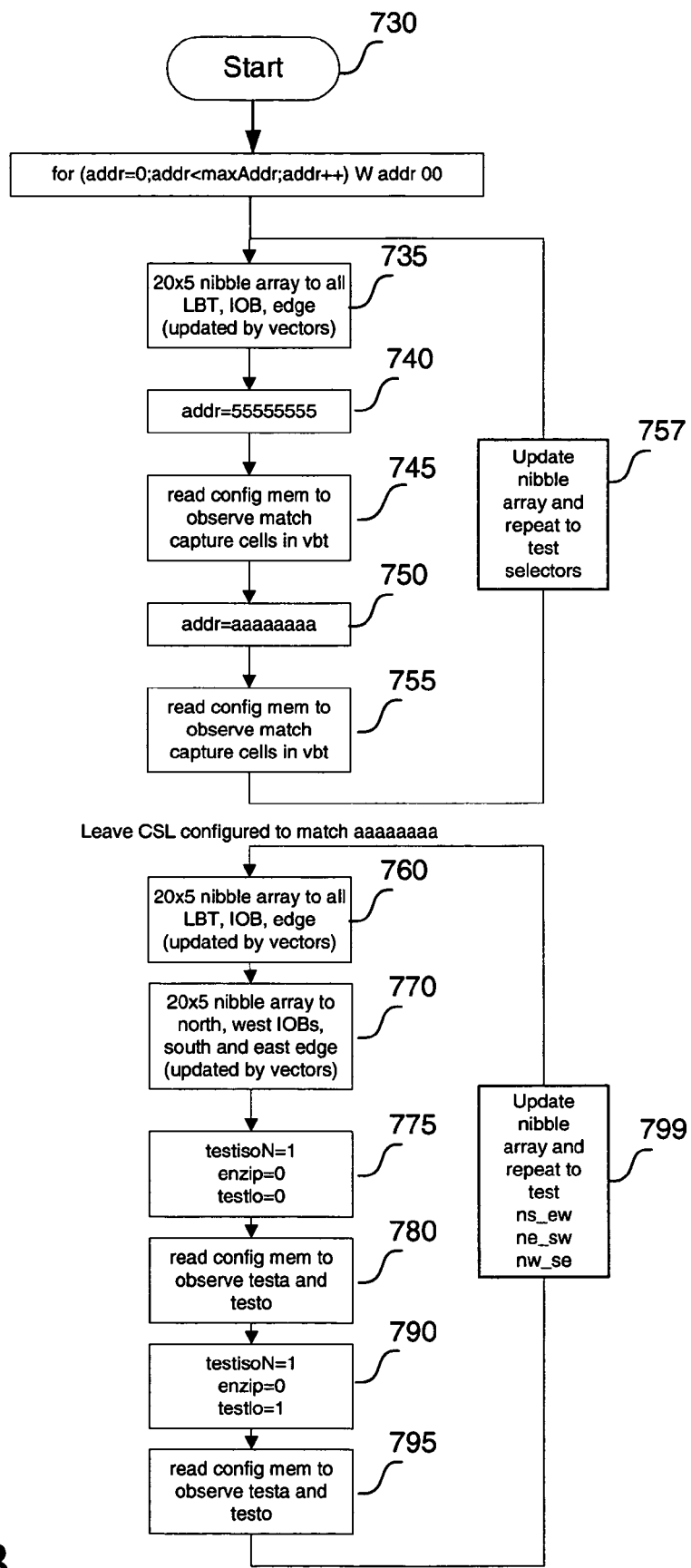
FIG. 7B is a flowchart of one embodiment of the improved test address decoding for the self-test possible as a result of the alterations of FIG. 6A.

FIG. 7B is a flowchart of one embodiment of the improved test address decoding for the self-test possible as a result of the alterations of FIG. 7A. The process starts at block 730. At block 735, data is propagated to all addresses, using vectors. For one embodiment, the data is a 20×5 nibble array.

At block 740, the address is set to a value for evaluation. For one embodiment, that value is 55,555,555 in hexadecimal. At block 745, the configuration memory is read to determine whether the data captured by the SRAM capture cells matches the data input to the address. If the data does not match, the process determines that there is an error. An error flag may be raised. Alternatively, the erroneous data captured by capture cells is used as the data flag.

At block 750, the address is set to another value, for one embodiment AAAAAAAA, in hexadecimal. Again, the capture cells are read, to determine whether the data successfully propagated through the address decoders. Again, the error flag may be raised if the captured data does not match the decoded input data.

The process then returns to update the nibble array, at block 757 and repeat the test. For one embodiment, the test is repeated for selectors set from 0000 to XXXX. For one embodiment, the selectors are programmed sequentially to XXX0, XXX1, XXXF, XX0X, XX1X, XXFX, X0XX, X1XX, XFXX, 0XXX, 1XXX, FXXX and XXXX. After this portion of the testing is completed, the process continues to block 760, for the second portion of the testing. For one embodiment, for this portion of the testing, the CSL remains configured to address AAAAAAAA.

At block 760, the 20×5 nibble arrays are written to all LBT, edges, and IOBs. As discussed above, this data is updated by vectors, reducing the requirements on the tester.

At block 770, the 20×5 nibble arrays are written to the north and west IOBs (i.e. exterior IOBs) as well as to the south and east edges. Again, for one embodiment, vectors are used for updating this data.

At block 775, the signals are set to run a first test. For one embodiment, the signals are set to: testisoN=1 (isolating the circuit to be tested), enzip=0, testlo=0 (pulling the signal to a one.) Note that this specific configuration of signal is merely exemplary. One skilled in the art would know that the described tests set signals to initially drive 1's and then drive 0's through the memory being tested. The present signal description is merely designed to provide an example of such a methodology.

At block 780, the configuration memory is read, to observe the outputs testa and testo, and verify that the expected outputs have been received. This test is used to verify that the outputs of the address decoder can drive interconnect to the LBT iMUXes. This data is stored, and compared to expected results by the tester. Again, flags may be raised if the results do not match the expected results.

At block 790, the signals are reset, to testisoN=1 (continuing isolation), enzip=0, and testlo=1. This drives a zero through the circuit.

Again, at block 795, the configuration memory is read to observe the outputs testa and testo, and verify that that the expected outputs have been received.

At block 799, the nibble array is updated, and the test is repeated. Note that the nibble array update writes different data to the address decoders being tested. For one embodiment, the update occurs three additional times, to test in all directions. For one embodiment, the directions are ns-ew, ne-sw, and nw-se.

FIG. 8 is a circuit diagram illustrating one embodiment of the row select and column select (RSEL/CSEL) gating alterations for improved self-test capabilities. The RSEL/CSEL are gated to allow multiple tiles to be written to simultaneously. For one embodiment, the CSELs within a bank are tied together, as shown, by line 840. Tying together the CSELs allows an 8 bit data bus to configure all tiles in a bank row. By tying the CSEL signals together, multiple banks may be programmed simultaneously. CRC logic 810 is added to permit testing of the memory in each bank. For one embodiment, every vertical breaker tile receives an additional CRC logic 810. The memory data is read out to the CRC logic 810, and the CRC (cyclic redundancy check) test is performed. This permits the simultaneous testing of multiple memories, to determine whether all of those memories are error free. Note that there is a vertical breaker tile per column per bank, thus there is a CRC engine associated with each bank and each column within each bank.

By adding the address decode test (adectst) signal, to select one of two signals in MUXes 830, the system can switch between a testing mode and a normal operation. In testing mode the tied-together signals 830 are selected, thus only CSEL[0] needs to be written to, to program all four columns, as shown in this example. In normal operation, the normal signals are selected, and each CSEL signal is individually activated. Note that although four columns are shown here, actual implementation may vary in the number of rows and columns per bank. The above-described strategy may apply to a memory bank of any size. The CRC logic 810 determines whether the data read from the signals, on each column, reflect the data written in. For one embodiment, capture cells, not shown in FIG. 8, may be used to capture the outputs of the CRC logics 810.

Figure 9:
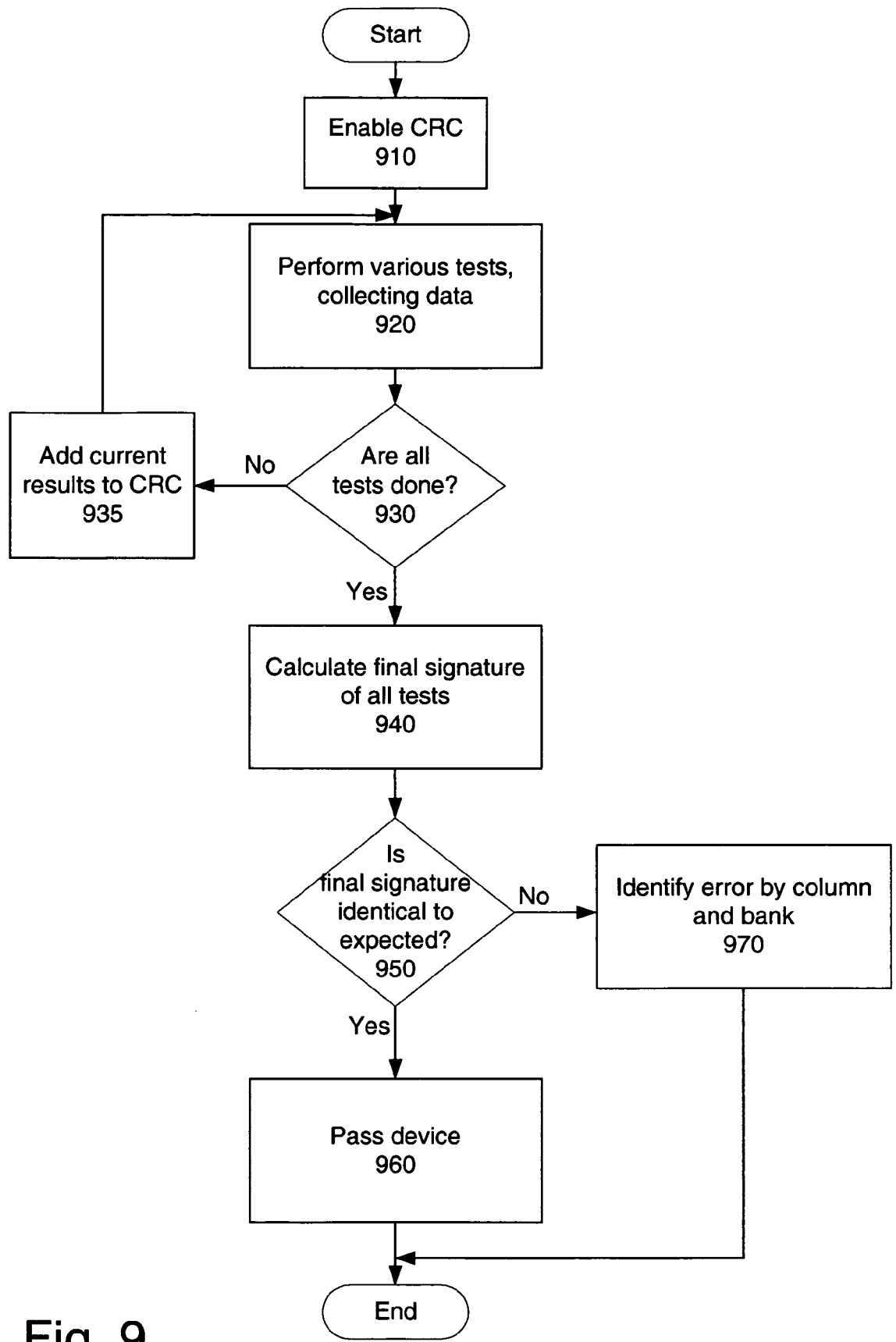
FIG. 9 is a flowchart of one embodiment of an improved CRC read-back mechanism.

FIG. 9 is a flowchart of one embodiment of an improved CRC read-back mechanism. For one embodiment, each vertical breaker tile (VBT) has a linear feedback shift register (LFSR) to calculate the cyclic redundancy check (CRC) for configuration read operations. This permits the simultaneous testing of all banks and all columns of all banks. The test time and test vector size are both array size independent. This is advantageous as the system can be used to test circuits having various array sizes.

The output of the LFSR is unique based on the input data. For one embodiment, a 16-bit CRC is used. Using a larger CRC value improves the odds of detecting a failure, but requires more space. Thus, an arbitrary CRC size may be used, but the size and effectiveness trade-offs are kept in mind. The CRC is enabled, when test mode is initiated, at block 910. For one embodiment, the CRC has a separate enable and reset.

The data from all observation nodes is fed into the LFSR, as various tests are performed, at block 920. The process determines whether all tests are done, at block 930. If not, the CRC results are updated, and the process continues to block 920, to continue performing tests. As is known in the art, in order to produce the CRC signature, data is continuously fed into the system, for one embodiment. For another embodiment, all data is collected at the same time. If the testing process is finished, the process continues to block 940.

At block 940, the unique signature (CRC signature) that results from the tests is calculated. At block 950, the final signature is evaluated to determine whether it matches the known content that should have been received from the observation nodes. If the final signature is identical to the expected signature, the device is passed at block 960. This indicates that the device has been successfully tested. Otherwise, the error indicated by the CRC is identified, at block 970. For one embodiment, the error may be identified by column and bank within the configurable logic. This may enable someone reviewing these results to either bypass the bank with the problem, or to potentially fix the problem.

Both the DMA and the JTAG have CRC engines. For one embodiment, the results described above are read through the last engine. The results are passed from CRC to CRC, resulting in a final result being output from the last engine in the chain. This final signature is written to a pass file, which is used to determine whether the device has passed the tests.

For one embodiment, the output of the LFSR is read back from the configuration plane without disturbing the CRC content. This is done using a CRC enable signal. For one embodiment, the CRC enable signal is driven by the BIST engine. For one embodiment, using RSEL and CSEL duplication, or the gating method discussed above, all CSL bank columns are read simultaneously. This produces an aggregate result in minimal time, which indicates if there are any problems with any banks. Note that this test identifies a bank and specific column, but does not actually identify which tile of the column in the bank has the problem. However, if a problem is in fact found, more detailed and time-consuming tests may be performed, such as the tests described above, to pinpoint the point of failure. A fast CRC check, described here, may simply verify that the system is good.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A system-on-a-chip comprising:
   a processor;
   programmable logic coupled to the processor, wherein the programmable logic comprises a plurality of interconnected banks arranged in an array;
   a built-in self test (BIST) mechanism coupled to the programmable logic to perform one or more tests on the programmable logic; and
   a test isolation signal that allows testing of a part of the programmable logic
   a mechanism to provide test data for one block within one bank of the array; and
   wherein the BIST mechanism replicates the test data to provide the test data to the plurality of interconnected banks of the array.

2. The system-on-a-chip of claim 1 further comprising:
   a plurality of vertical breaker tiles within the programmable logic; and
   a linear feedback shift register associated with each of the plurality of vertical breaker tiles to calculate a cyclic redundancy check (CRC) of data from observation nodes within the programmable logic, to verify that the programmable logic is performing as expected.

3. The system-on-a-chip of claim 2, further comprising:
   a plurality of observation capture cells to capture results from the tests;
   wherein corruption comprises one or more memory cells that store data incorrectly.

4. The system-on-a-chip of claim 1, further comprising: wherein the BIST mechanism comprises a signal received from an external tester with the test data.

5. The system-on-a-chip of claim claim 1, further comprising: wherein the BIST mechanism comprises Read Only Memory (ROM) internal to the system-on-a-chip, the ROM storing the test data.

6. The system-on-a-chip of claim 1, further comprising:
   a plurality of multiplexers, each multiplexer receiving a plurality of signals from a plurality of lines;
   a plurality of switches driven by the test isolation signal, to isolate the plurality of signals from and to a multiplexer currently being tested; and
   logic circuitry to test whether data driven into the multiplexer currently being tested is accurately driven through the multiplexer.

7. The system-on-a-chip of claim 6, wherein the plurality of switches comprise a plurality of transistors inline with the plurality of lines, a gate of the transistors controlled by the test isolation signal.

8. The system-on-a-chip of claim 6, wherein the logic circuitry comprises a ZIP switch tester comprising:
- drive logic to drive a logical one or a logical zero through a ZIP switch; and
- a configurable capture memory to capture an output of an AND gate and an OR gate to determine whether the signals driven by the drive logic were successfully transmitted.

9. The system-on-a-chip of claim 8, further comprising a latch interposed between the configurable capture memory and the AND gate and the OR gate, to capture the outputs of the AND and the OR gates at a proper time.

10. A system for testing a system-on-a-chip including a processor and a configurable system logic (CSL), the system comprising:
- means for performing a plurality of tests on the CSL using vector arrays to verify that banks and interconnections between the banks are functioning;
- means for generating a single cyclic redundancy check (CRC) output of the tests; and
- if the CRC result corresponds to an expected result, means for passing the system-on-a-chip.

11. The system of claim 10, further comprising:
- means for calculating intermediate CRC values associated with each of a plurality of vertical breaker tiles.

12. The system of claim 10, further comprising:
- means for isolating a plurality multiplexers and means for retaining one non-isolated multiplexer in a memory bank; and
- means for testing whether data driven into the non-isolated multiplexer currently being tested is accurately driven through the multiplexer.

13. A system on a chip comprising:
- programmable logic;
- a plurality of multiplexers coupled to the programmable logic;
- built-in self test (BIST) circuitry coupled to a multiplexer of the plurality of multiplexers to perform testing on the multiplexer; and
- test isolation circuitry configured to isolate the multiplexer for testing.

14. The system on a chip of claim 13 wherein the test isolation circuitry comprises a plurality of transistors controlled by a test isolation signal.

15. The system on a chip of claim 13 wherein the plurality of multiplexers are configured via one or more configuration memory cells and the testing is of the one or more configuration memory cells.

* * * * *